(12) United States Patent  
Okamura et al.

(10) Patent No.: US 8,128,201 B2
(45) Date of Patent: Mar. 6, 2012

(54) NON-WETTING COATING ON A FLUID EJECTOR

(75) Inventors: Yoshimasa Okamura, San Jose, CA (US); Jeffrey Birkmeyer, San Jose, CA (US); John A. Higginson, Santa Clara, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 921 days.

(21) Appl. No.: 11/948,692

(22) Filed: Nov. 30, 2007

(65) Prior Publication Data

US 2008/0136866 A1 Jun. 12, 2008

Related U.S. Application Data

(60) Provisional application No. 60/871,763, filed on Dec. 22, 2006, provisional application No. 60/868,536, filed on Dec. 4, 2006, provisional application No. 60/868,328, filed on Dec. 1, 2006.

(51) Int. Cl.
*B41J 2/135* (2006.01)

(52) U.S. Cl. ............................................. 347/45; 347/71

(58) Field of Classification Search .................... 347/40, 347/45–47, 64, 67, 71, 86–87
See application file for complete search history.

(56) References Cited

U.S. PATENT DOCUMENTS

| 5,121,134 | A | 6/1992 | Albinson et al. |
| 5,595,785 | A | 1/1997 | Hindagolla et al. |
| 5,606,352 | A | 2/1997 | Yamakawa et al. |
| 5,781,213 | A | 7/1998 | Ujita et al. |
| 5,910,372 | A | 6/1999 | Griffin et al. |
| 5,959,643 | A | 9/1999 | Temple et al. |
| 6,283,578 | B1 | 9/2001 | Popall et al. |
| 6,312,103 | B1 | 11/2001 | Haluzak |
| 6,325,490 | B1 | 12/2001 | Yang et al. |
| 6,364,456 | B1 | 4/2002 | Yang et al. |
| 6,416,159 | B1 | 7/2002 | Floyd et al. |
| 6,428,142 | B1 | 8/2002 | Silverbrook et al. |
| 6,472,332 | B1 | 10/2002 | Gooray |
| 6,488,357 | B2 | 12/2002 | Skinner et al. |
| 6,561,624 | B1 | 5/2003 | Kikugawa et al. |

(Continued)

FOREIGN PATENT DOCUMENTS

EP 1157842 A1 11/2001

(Continued)

OTHER PUBLICATIONS

Office action dated Sep. 27, 2010, State Intellectual Property Office of the People's Republic of China, issued in counterpart Chinese application No. 200780044031.5, 8 pgs.

(Continued)

*Primary Examiner* — Thinh Nguyen
(74) *Attorney, Agent, or Firm* — Fish & Richardson P.C.

(57) ABSTRACT

A fluid ejector having a first surface, a second surface, and an orifice that allows fluid in contact with the second surface to be ejected. The fluid ejector has a non-wetting layer exposed on at least a first surface of the fluid ejector, and a overcoat layer exposed on a second surface, the overcoat layer being more wetting than the non-wetting layer. Fabrication of this apparatus can include depositing a non-wetting layer on the first and second surfaces, masking the first surface, optionally removing the non-wetting layer from the second surface, and depositing an overcoat layer on the second surface.

31 Claims, 7 Drawing Sheets

U.S. PATENT DOCUMENTS

| | | | |
|---|---|---|---|
| 6,676,244 | B2 | 1/2004 | Kwon et al. |
| 6,827,973 | B2 | 12/2004 | Nagashima |
| 6,938,986 | B2 | 9/2005 | Macler et al. |
| 7,104,632 | B2 | 9/2006 | Song et al. |
| 7,347,532 | B2 | 3/2008 | Chen et al. |
| 7,622,048 | B2 | 11/2009 | Birkmeyer et al. |
| 7,837,300 | B2 * | 11/2010 | Mori .............................. 347/45 |
| 2003/0030697 | A1 | 2/2003 | Kwon et al. |
| 2003/0042545 | A1 | 6/2003 | Voutsas et al. |
| 2003/0197758 | A1 | 10/2003 | Sasaki et al. |
| 2004/0002225 | A1 | 1/2004 | Wong et al. |
| 2004/0125169 | A1 | 7/2004 | Nakagawa et al. |
| 2005/0046663 | A1 | 3/2005 | Silverbrook |
| 2006/0057851 | A1 | 3/2006 | Wong et al. |
| 2007/0030306 | A1 | 2/2007 | Okamura et al. |
| 2008/0150998 | A1 | 6/2008 | Okamura |
| 2011/0063369 | A1 | 3/2011 | Okamura |

FOREIGN PATENT DOCUMENTS

| | | |
|---|---|---|
| EP | 1375154 A2 | 1/2004 |
| EP | 1568500 A1 | 8/2005 |
| JP | 9 085 956 | 3/1997 |
| JP | 9085956 | 3/1997 |
| JP | 10-235858 | 8/1998 |
| WO | 03/013863 | 2/2003 |
| WO | 2005/007411 | 1/2005 |
| WO | 2005/007413 | 1/2005 |
| WO | 2005/037558 A2 | 4/2005 |
| WO | 2007/005857 | 1/2007 |
| WO | 2010/051272 | 5/2010 |

OTHER PUBLICATIONS

Search report dated Dec. 28, 2010, European Patent Office, issued in counterpart European application No. 07865036.3, 3 pgs.

Applied MicroStructures, Inc., "Common Precursors Used in MEMS", 2004, pp. 1-2.

Ashurst, et al., "Vapor Phase Anti-Stiction Coatings for MEMS", IEEE Transactions on Device and Materials Reliability, vol. 3, No. 4, Dec. 2003, pp. 173-178.

Ashurst, et al., "Dichlorodimethylsilane as an Anti-Stiction Monolayer for MEMS: A Comparison to the Octadecyltrichlosilane Self-Assembled Monolayer", Journal of Microelectromechanical Systems, vol. 10, No. 1, Mar. 2001, pp. 41-49.

Bunker et al., "The Impact of Solution Agglomeration on the Deposition of Self-Assembled Monolayers," Sandia National Laboratories, Received Apr. 4, 2000, Published on the Web Aug. 26, 2000, pp. 7742-7751.

Kobrin, et al., "Molecular Vapor Deposition—An Improved Vapor-Phase Deposition Technique of Molecular Coatings for MEMS Devices", SEMI® Technical Symposium: Innovations in Semiconductor Manufacturing, Semicon West 2004, pp. 1-4.

Office action issued in Chinese application No. 200780044031.5 dated Apr. 26, 2011, 8 pgs.

Office action issued in European application No. 07865036.3 dated Jan. 11, 2011, 5 pgs.

Office action issued in European application No. 07865036.3 dated Feb. 15, 2011, 5 pgs.

* cited by examiner

NON-WETTING COATING ON A FLUID EJECTOR

CROSS REFERENCE TO RELATED APPLICATIONS

This application claims priority to pending U.S. Provisional Application Ser. No. 60/871,763, filed on Dec. 22, 2006; to pending U.S. Provisional Application Ser. No. 60/868,536, filed on Dec. 4, 2006; and to pending U.S. Provisional Application Ser. No. 60/868,328, filed on Dec. 1, 2006, the entire contents of each of which are hereby incorporated by reference.

TECHNICAL FIELD

This invention relates to coatings on fluid ejectors.

BACKGROUND

A fluid ejector (e.g., an ink-jet printhead) typically has an interior surface, an orifice through which fluid is ejected, and an exterior surface. When fluid is ejected from the orifice, the fluid can accumulate on the exterior surface of the fluid ejector. When fluid accumulates on the exterior surface adjacent to the orifice, further fluid ejected from the orifice can be diverted from an intended path of travel or blocked entirely by interaction with the accumulated fluid (e.g., due to surface tension).

Non-wetting coatings such as Teflon® and fluorocarbon polymers can be used to coat surfaces. However, Teflon® and fluorocarbon polymers typically are soft and are not durable coatings. These coatings also can be expensive and difficult to pattern.

SUMMARY

The disclosure features a fluid ejector having a first surface, a second surface, and an orifice that allows fluid in contact with the second surface to be ejected. In one aspect, the fluid ejector has a non-wetting layer covering portions of at least the first surface, and an overcoat layer covering portions of the second surface but not a substantial portion of the first surface, the overcoat layer being more wetting than the non-wetting layer.

Implementations of this apparatus may include one or more of the following features. The non-wetting layer may include molecules which include at least one atom each of carbon and fluorine. The non-wetting layer may be a monolayer. The non-wetting layer may be hydrophobic. The non-wetting layer may be formed directly on an inorganic seed layer. The overcoat layer may include an inorganic oxide, such as silicon dioxide. The overcoat layer may be hydrophilic. In one implementation, the overcoat layer may be formed directly on the non-wetting layer. In an alternative implementation, the overcoat layer may be formed directly on an inorganic oxide layer. In implementations, the first surface may be an exterior surface of the fluid ejector.

The disclosure also features methods of forming a non-wetting monolayer on a selected portion of a fluid ejector. A non-wetting layer is deposited on a first and second surfaces of a fluid ejector, the first surface is masked, the non-wetting layer is optionally removed from the second surface, and an overcoat layer is deposited on the second surface.

Implementations of these methods may include one or more of the following features. The non-wetting layer may be deposited by vapor deposition. Masking may include applying at least one of tape, photoresist, or wax. Depositing the overcoat layer may include depositing an inorganic oxide. The inorganic oxide may be silicon dioxide. In certain implementations, the mask may be removed from the first surface after the overcoat layer is deposited, and removing the mask may also remove overcoat layer deposited on the mask. In other implementations, the mask may be removed before the overcoat layer is deposited but after exposing the fluid ejector to oxygen plasma. An inorganic layer may be deposited on the first and second surfaces prior to depositing the non-wetting layer. The first surface may include a region surrounding an orifice in the fluid ejector, and the second surface may include a region that contacts fluid to be ejected by the fluid ejector. The first surface may be an exterior surface and the second surface may be an interior surface.

Certain implementations may have one of more of the following advantages. The exterior surfaces surrounding the orifice may be non-wetting, and interior surfaces that contact fluid to be ejected may be wetting. The non-wetting layer may reduce the accumulation of fluid on the exterior surface of the fluid ejector, and may thereby improve reliability of the fluid ejector. The non-wetting layer can be durable and can be insoluble in most solvents, allowing multiple types of inks to be used with the fluid ejector. The overcoat layer may cover any portions of the non-wetting coating that are not removed from the interior surface in a prior cleaning step, and may thereby ensuring that the interior surface is covered by a layer that is highly wetting. A highly wetting overcoat layer on surfaces contacting fluid to be ejected may enable improved control over droplet size, rate of ejection, and other fluid ejection properties.

DETAILED DESCRIPTION

Figure 1A:
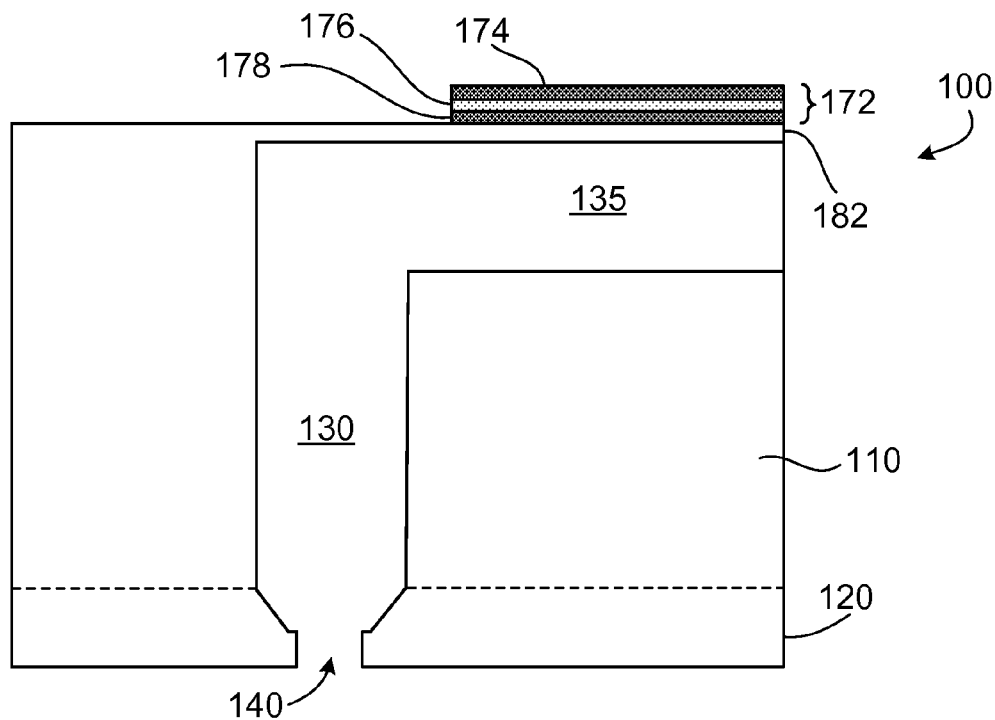
FIG. 1A is a cross-sectional view of an implementation of an uncoated fluid ejector.

FIG. 1A is a cross-sectional view of an uncoated fluid ejector 100 (e.g., an ink-jet printhead nozzle), which can be constructed as described in U.S. patent application Ser. No. 11/256,669, filed Oct. 21, 2005, the contents of which are hereby incorporated by reference. The uncoated fluid ejector 100 includes a flow-path module 110 and a nozzle layer 120, both of which can be made of silicon (e.g., single crystal silicon). In one implementation, the uncoated fluid ejector 100 is a single unit, and the flow-path module 110 and the nozzle layer 120 are not separate pieces. A membrane layer 182 is positioned above a pumping chamber 135. An actuator 172 pressurizes fluid (e.g., an ink, for example, a water-based ink) in the pumping chamber 135. The fluid flows through a descender 130 and is ejected through an orifice 140 in the nozzle layer 120. The actuator 172 can include a piezoelectric layer 176, a lower electrode 178 (e.g., a ground electrode), and an upper electrode 174 (e.g., a drive electrode). The membrane layer 182 and the actuator 172 are not shown in the following figures, but can be present.

Figure 1B:
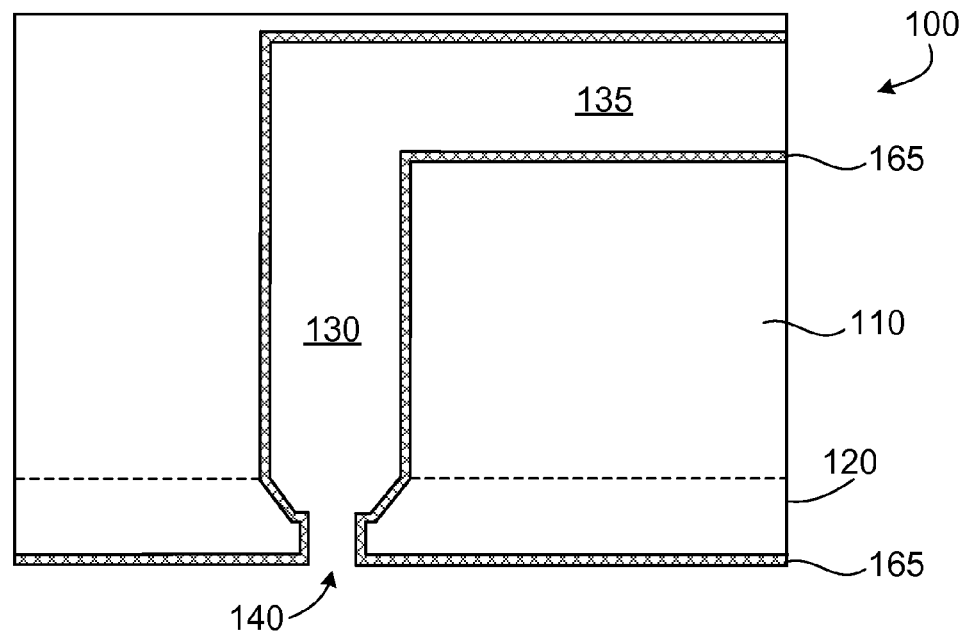
FIG. 1B is a cross-sectional view of an implementation of the fluid ejector from FIG. 1A with an inorganic layer deposited on all exposed surfaces.

As shown in FIG. 1B, the uncoated fluid ejector 100 optionally can include an inorganic layer 165 formed on exposed surfaces of the fluid ejector (e.g. the nozzle layer 120 and the flow-path module 110) including the interior and exterior surfaces. In such cases, the surface of the uncoated ejector can be considered the surface of the inorganic layer 165. Inorganic layer 165 may be formed of a material, e.g. an inorganic oxide, e.g., $SiO_2$, that promotes adhesion of silane or siloxane coatings. In one implementation, inorganic seed layer 165 is a native oxide layer (such a native oxide typically has a thickness of 1 to 3 nm). In another implementation, inorganic layer 165 is a deposited seed layer such as $SiO_2$.

Inorganic seed layer 165 of $SiO_2$ can be formed on exposed surfaces of nozzle layer 120 and flow-path module 110 by introducing $SiCl_4$ and water vapor into a chemical vapor deposition (CVD) reactor containing the uncoated fluid ejector 100. A valve between the CVD chamber and a vacuum pump is closed after pumping down the chamber, and vapors of $SiCl_4$ and $H_2O$ are introduced into the chamber. The partial pressure of the $SiCl_4$ can be between 0.05 and 40 Torr (e.g., 0.1 to 5 Torr), and the partial pressure of the $H_2O$ can be between 0.05 and 20 Torr (e.g., 0.2 to 10 Torr). Seed layer 165 may be deposited on a substrate that is heated to a temperature between about room temperature and about 100 degrees centigrade. For example, the substrate might not be heated, but the CVD chamber can be at 35 degrees centigrade. Alternatively, inorganic seed layer 165 can be sputtered. The surfaces to be coated by the inorganic seed layer 165 can be cleaned prior to coating by, for example, applying an oxygen plasma. In this process, an inductively coupled plasma (ICP) source is used to generate active oxygen radicals which etch organic materials, resulting in a clean oxide surface. One implementation of the fabrication process deposits the entire seed layer in a single continuous step to provide a unitary, monolithic seed layer.

The thickness of seed layer 165 can be between about 5 nm and about 200 nm. For some fluids to be ejected, the performance can be affected by the thickness of the inorganic layer. For example, for some "difficult" fluids, a thicker layer, e.g., 30 nm or more, such as 40 nm or more, e.g., 50 nm or more, will provide improved performance. Such "difficult" fluids can include, for example, various conducting polymers and light emitting polymers, e.g., poly-3,4-ethylenediox- ythiophene (PEDOT), or a light emitting polymer, such as DOW Green K2, from Dow Chemical. Other light emitting polymers (also known as polymer light-emitting diodes) are available from sources including Cambridge Display Technologies, Sumitomo Chemical, and Covion (a subsidiary of Merck KGaA).

Figure 1C:
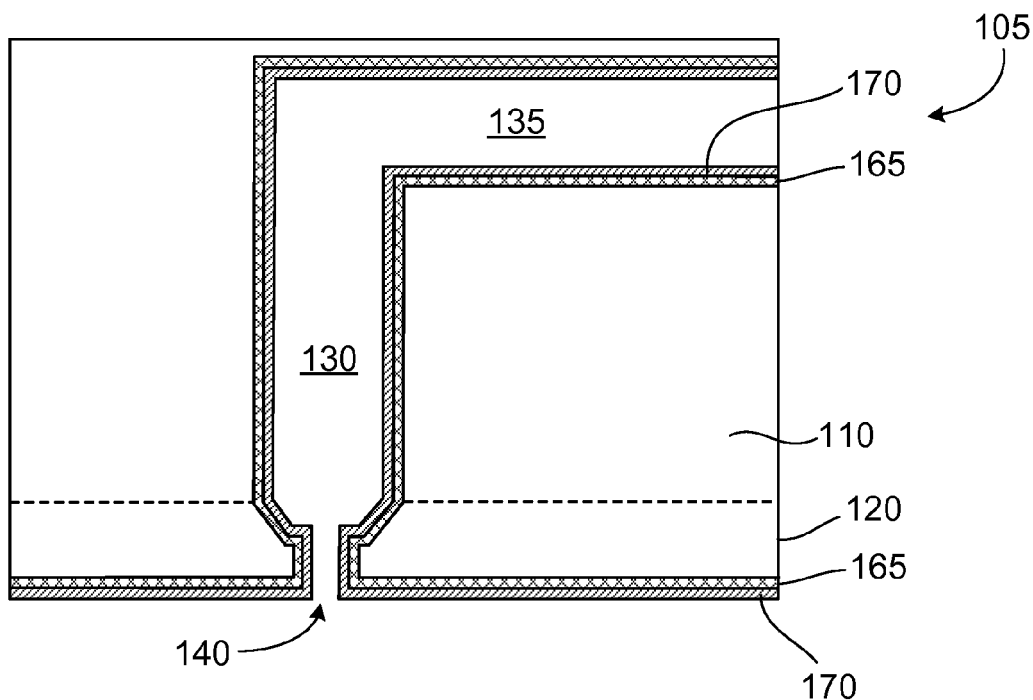
FIG. 1C is a cross-sectional view of an implementation of the fluid ejector from FIG. 1B with a non-wetting coating on all exposed surfaces.

Some materials from which fluid ejectors are fabricated (e.g., silicon or silicon oxide) are hydrophilic, which typically exacerbates the problem of fluid accumulation on the exterior surface when fluids are ejected. Referring to FIG. 1C, non-wetting coating 170, e.g., a layer of hydrophobic material, is deposited on exposed surfaces of the uncoated fluid ejector (or, optionally, fluid ejector coated with inorganic layer) 100 to form a coated fluid ejector 105. In one implementation, non-wetting coating 170 forms a self-assembled monolayer, i.e. a single molecular layer. Non-wetting coating 170 can be deposited using vapor deposition, rather than being brushed, rolled, or spun on. The outer surface of the fluid ejector can be cleaned (e.g., by applying an oxygen plasma) before applying the non-wetting coating 170.

The non-wetting coating 170 can be deposited, for example, by introducing a precursor and water vapor into the CVD reactor at a low pressure. The partial pressure of the precursor can be between 0.05 and 1 Torr (e.g., 0.1 to 0.5 Torr), and the partial pressure of the $H_2O$ can be between 0.05 and 20 Torr (e.g., 0.1 to 2 Torr). The deposition temperature can be between room temperature and about 100 degrees centigrade. The coating process and the formation of the inorganic seed layer 165 can be performed, by way of example, using a Molecular Vapor Deposition (MVD)™ machine from Applied MicroStructures, Inc.

Suitable precursors for the non-wetting coating 170 include, by way of example, precursors containing molecules that include a terminus that is non-wetting, and a terminus that can attach to a surface of the fluid ejector. For example, precursor molecules that include a carbon chain terminated at one end with a —$CF_3$ group and at a second end with an —$SiCl_3$ group can be used. Specific examples of suitable precursors that attach to silicon surfaces include tridecafluoro-1,1,2,2-tetrahydrooctyltrichlorosilane (FOTS) and 1H,1H,2H,2H-perfluorodecyl-trichlorosilane (FDTS). Without being limited by any particular theory, it is believed that when a precursor (such as FOTS or FDTS) whose molecules include an —$SiCl_3$ terminus are introduced into the CVD reactor with water vapor, silicon atoms from the —$SiCl_3$ groups bond with oxygen atoms from —OH groups on the native oxide, or inorganic layer 165, on exposed surfaces of the fluid ejector, resulting in a coating, such as a monolayer, of molecules with the other, i.e. non-wetting, terminus exposed.

The fabrication process may alternate between forming layers of the inorganic seed material and layers of the non-wetting coating. In these cases, the individual seed layers can be between about 5 nm and about 200 nm thick. The exposed surfaces of the device can be cleaned (e.g., by applying oxygen plasma) before forming the layer of seed material. Hypothetically, this fabrication process could result in a layer stack with alternating layers of seed material and non-wetting coating. However, without being limited to any particular theory, under some conditions the cleaning process might remove the immediately previously deposited non-wetting coating, such that the resulting device has a single continuous thick seed layer (rather than alternating layers of oxide and non-wetting coating). For purposes of clarity, note that in this process, the last process forms a layer of non-wetting coating, so that the outermost surface is non-wetting.

In another implementation, the coated fluid ejector 105 does not include the inorganic seed layer 165, and the non-wetting coating 170 is applied directly to native surfaces of the fluid ejector.

Figure 1D:
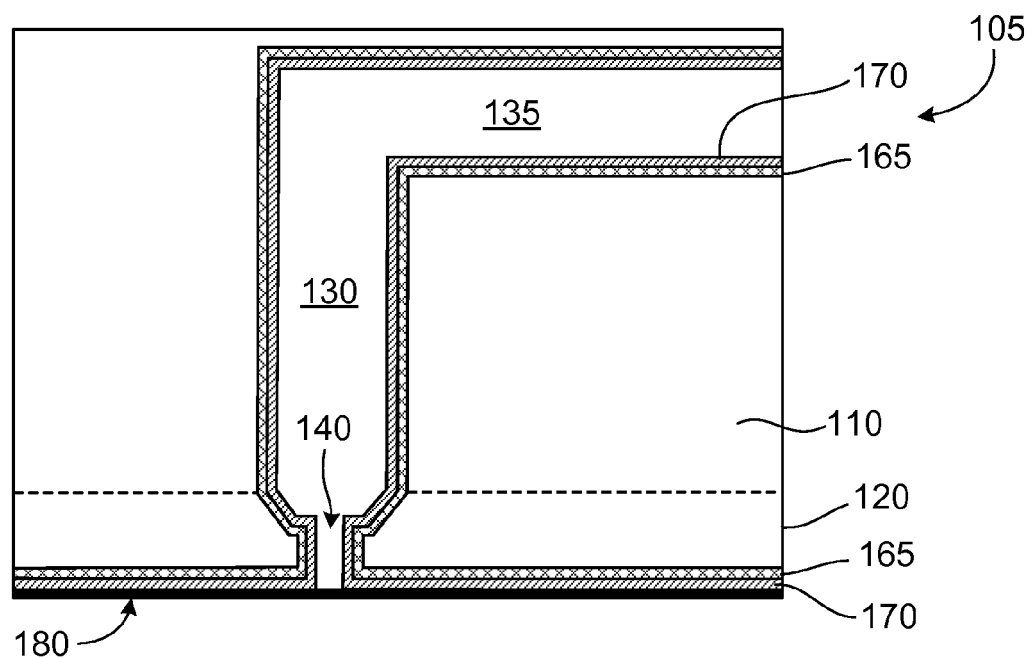
FIG. 1D is a cross-sectional view of an implementation of the fluid ejector from FIG. 1C with a mask covering an exterior surface.

Referring to FIG. 1D, a mask 180 is applied to an outer surface of the fluid ejector, i.e. a region surrounding orifice 140. The masking layer may be formed from various materials. For example, tape, wax, or photoresist can be used as a mask. Mask 180 protects the surface onto which it is applied from removal or damage resulting during a cleaning step (e.g. from exposure to oxygen plasma), and/or from subsequent deposition (e.g., from deposition of an overcoat layer). Mask 180 may have sufficiently low adhesion so that it may be removed without removing or damaging or otherwise materially altering non-wetting coating 170 beneath it.

Figure 1E:
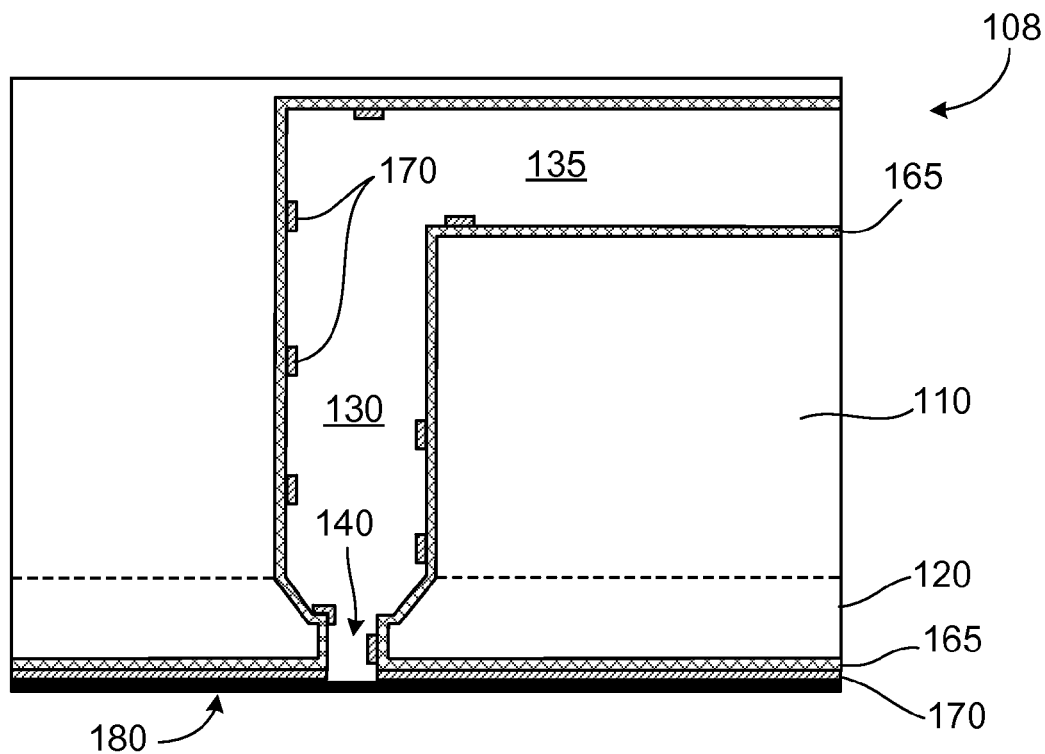
FIG. 1E is a cross-sectional view of an implementation of the fluid ejector from FIG. 1D in which the non-wetting coating has been partially removed from the interior surface.

Referring to FIG. 1E, the fluid ejector can be subjected to a cleaning step, for example a cleaning gas, e.g., an oxygen plasma treatment, that removes a portion of the non-wetting coating that is not covered by mask 180. The oxygen plasma can be applied to a substrate inside a chamber, or the source of oxygen plasma can be connected to the inlet of the fluid path. In the former case, the mask 180 prevents the oxygen plasma in the chamber on the outside of the fluid ejector from removing the non-wetting coating on the exterior surface. In the later case, the mask 180 prevents the oxygen plasma from escaping through the orifices (and in this case, the mask need only cover the orifices themselves) and removing the non-wetting coating on the exterior surface.

The cleaning step may not be completely effective in removing the non-wetting coating from the interior surface, particular in the region of the nozzles. However, the cleaning step is sufficiently effective that the subsequently deposited overcoat layer will adhere and cover the non-wetting that remains on the interior surface of the fluid ejector. Without being limited to any particular theory, the interior surface might be left with patches or regions of non-wetting coating and other patches or regions of exposed seed layer that are sufficiently large to permit adhesion of the overcoat layer, or the non-wetting on the interior surface might be damaged to permit adhesion of the overcoat layer.

Figure 1F:
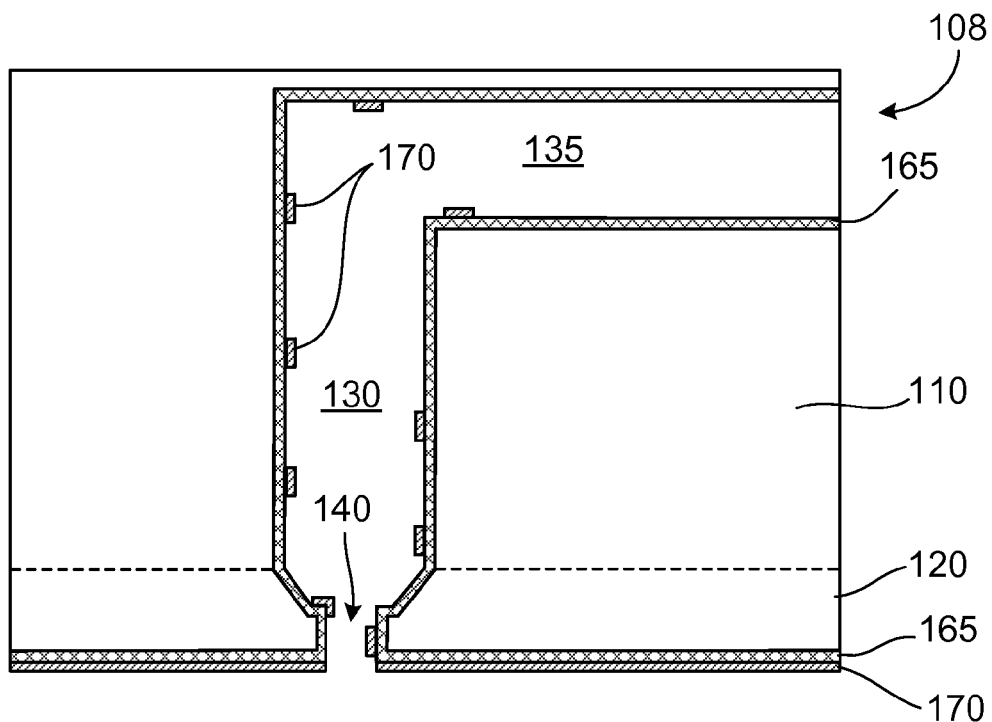
FIG. 1F is a cross-sectional view of an implementation of the fluid ejector from FIG. 1E with the mask removed.

Referring to FIG. 1F, following the cleaning step, the mask 180 is removed. Alternatively, the mask can be removed after deposition of overcoat layer.

Figure 1G:
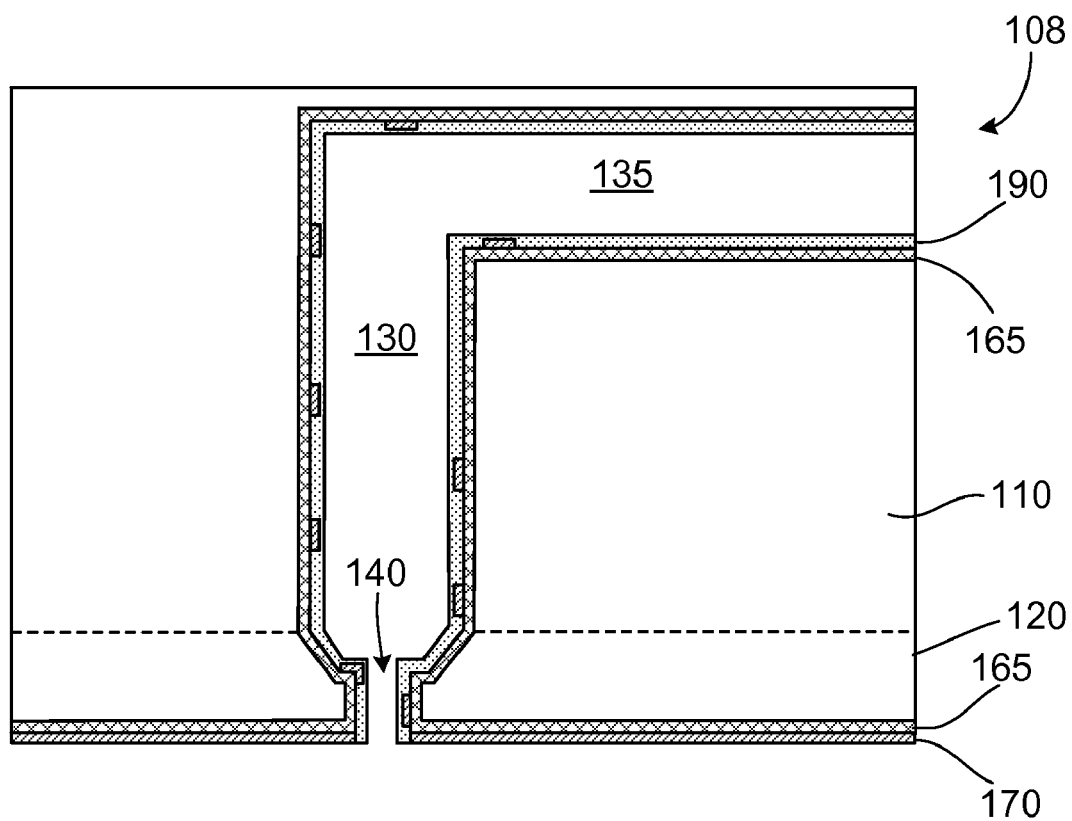
FIG. 1G is a cross-sectional view of an implementation of the fluid ejector from FIG. 1F with an overcoat layer coating an interior surface.

Referring to FIG. 1G, overcoat layer 190 is applied to exposed (unmasked if a mask is still present) surfaces of the coated fluid ejector 105 to form selectively coated fluid ejector 107. The material of the non-wetting coating can be such that the overcoat layer does not adhere to the non-wetting coating 170 during deposition (thus, the mask can be removed before deposition of overcoat layer, but the overcoat layer will not adhere to and not be formed on the non-wetting coating 170). However, as noted above, the cleaning step is sufficiently effective that the overcoat layer will adhere and cover any non-wetting material that remains on the surfaces, e.g., interior surface, of the fluid ejector that have been subject to cleaning.

The overcoat layer 190 provides an exposed surface, e.g., in the interior of the completed device, that is highly wetting. In some implementations, overcoat layer 190 is formed from an inorganic oxide. For example, the inorganic oxide may include silicon, e.g., the inorganic oxide may be $SiO_2$. Overcoat layer 190 may be deposited by conventional means, such as CVD as discussed above, and an initial cleaning step, e.g., oxygen plasma, can be used so that the non-wetting will adhere to the desired surface. In addition, the same apparatus may be used to both clean surfaces to be deposited and to deposit the overcoat layer. Overcoat layer 190 may be more wetting than non-wetting coating 170.

In certain implementations, the overcoat layer 190 may be deposited under the same conditions and have basically the same material properties, e.g., the same wettability, as the seed layer 165. The overcoat layer 190 can be thinner than the seed layer 165.

In other implementations, the overcoat layer 190 may be deposited under the different conditions and have different material properties from the seed layer 165. For example, overcoat layer 190 may be less dense and more porous, than seed layer 165. For example, overcoat layer 190 may have a density lower than about 2.4 $g/cm^3$, e.g. lower than about 2.2 $g/cm^3$, e.g. about 2.0 $g/cm^3$ as measured by x-ray reflectivity. In contrast, seed layer 165, deposited by methods described above, (i.e. by heating the substrate during deposition to between about room temperature and about 100 degree centigrade) may have a density of greater than about 2.4 $g/cm^3$, e.g. about 2.6 $g/cm^3$. In these implementations, overcoat layer 190 may be more wettable than seed layer 165. For example, overcoat layer 190 may have a contact angle with water of less than about 30 degrees, e.g. less than about 20 degrees, e.g. less than 10 degrees. In contrast, seed layer 165 may have a contact angle with water greater than about 30 degrees, e.g. about 40 degrees.

In summary, in the final product, surfaces surrounding orifice 140 (e.g., exterior surfaces) are non-wetting, and surfaces contacting fluid to be ejected (e.g., interior surfaces) are more wetting than surfaces coated with the non-wetting coating.

Figure 2A:
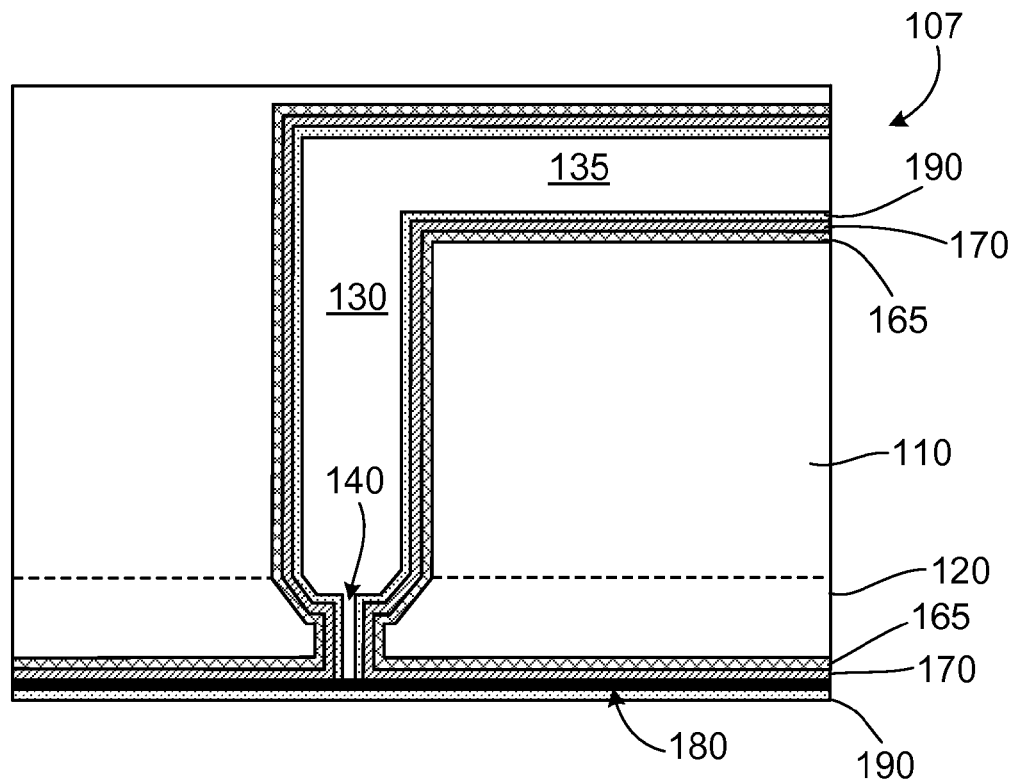
FIG. 2A is a cross-sectional view of an implementation of the fluid ejector from FIG. 1D with an overcoat layer coating an interior surface.
Figure 2B:
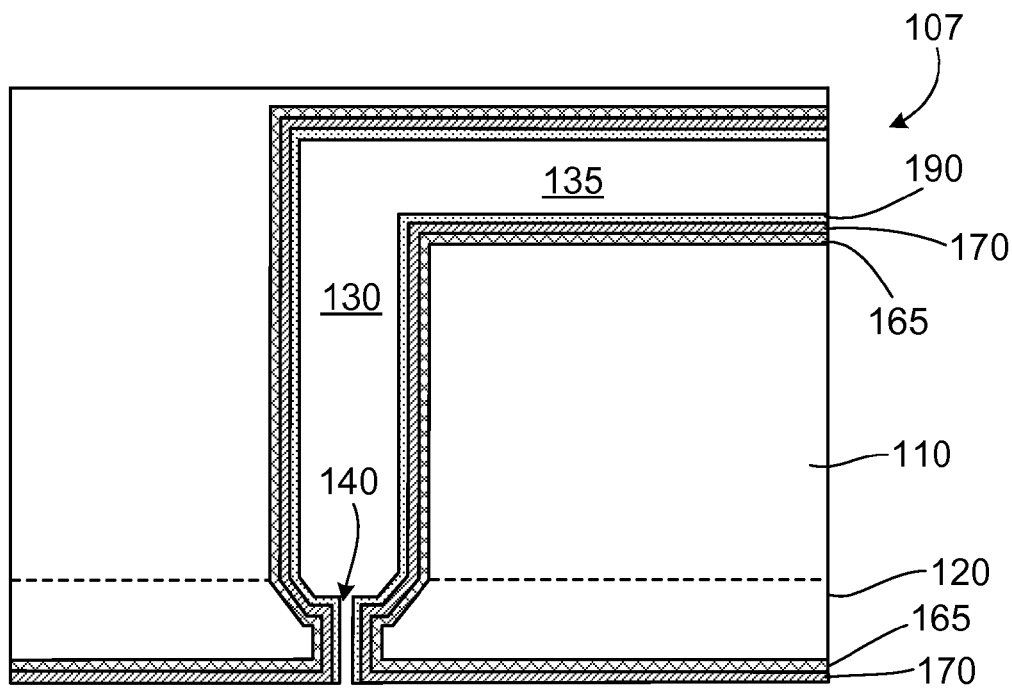
FIG. 2B is a cross-sectional view of an implementation of the fluid ejector from FIG. 2A with the mask removed.

Referring to FIGS. 2A-2B, in some implementations, the overcoat layer 190 is a material that does adhere to the non-wetting coating, even without a prior cleaning step. In this case, the overcoat layer 190 can applied to the interior surface without a prior cleaning step.

Referring to FIG. 2A, the mask 180 is applied after deposition of the non-wetting coating 170. Mask 180 may be reversibly attached and may be removed when protection of the masked surface is no longer needed, e.g., after deposition of overcoat layer 190.

Still referring to FIG. 2A, overcoat layer 190 can then be deposited. The overcoat layer 190 can coat the exposed interface surface of the fluid ejector. The overcoat layer can also coat exposed surfaces of mask 180, e.g., exposed interior and exterior surfaces. For instance, the fluid ejector 105 with mask attached may be placed in a CVD reactor into which precursors to overcoat layer 190, e.g. $SiCl_4$ and water vapor, are introduced. In such an implementation, the overcoat layer is formed on the exterior surface of the mask and the portion of the interior surface spanning the nozzle.

Referring to FIG. 2B, the overcoat layers on the mask are removed when the mask is removed from non-wetting coating 170. Thus, the completed device in FIG. 2B has certain surfaces that are non-wetting and other surfaces that are more wetting than surfaces coated with the non-wetting coating.

In alternative implementations, overcoat layer 190 does not coat the exposed exterior surface of mask 180, either because overcoat layer 190 is deposited only on interior surfaces, (e.g., the portion of the interior surface spanning the aperture) or because the overcoat layer does not physically adhere to the mask. The former case may be accomplished, for example, by equipping fluid ejector 105 with a suitable attachment so that precursors to overcoat layer 190 (e.g. $SiCl_4$ and water vapor) are introduced only to interior exposed surfaces of the fluid ejector (i.e. surfaces that will contact fluid to be ejected from the fluid ejector). In these implementations, mask 180 may be applied to a sufficiently localized region surrounding orifice 140 to prevent the overcoat layer from reaching exterior surface regions.

Figure 3A:
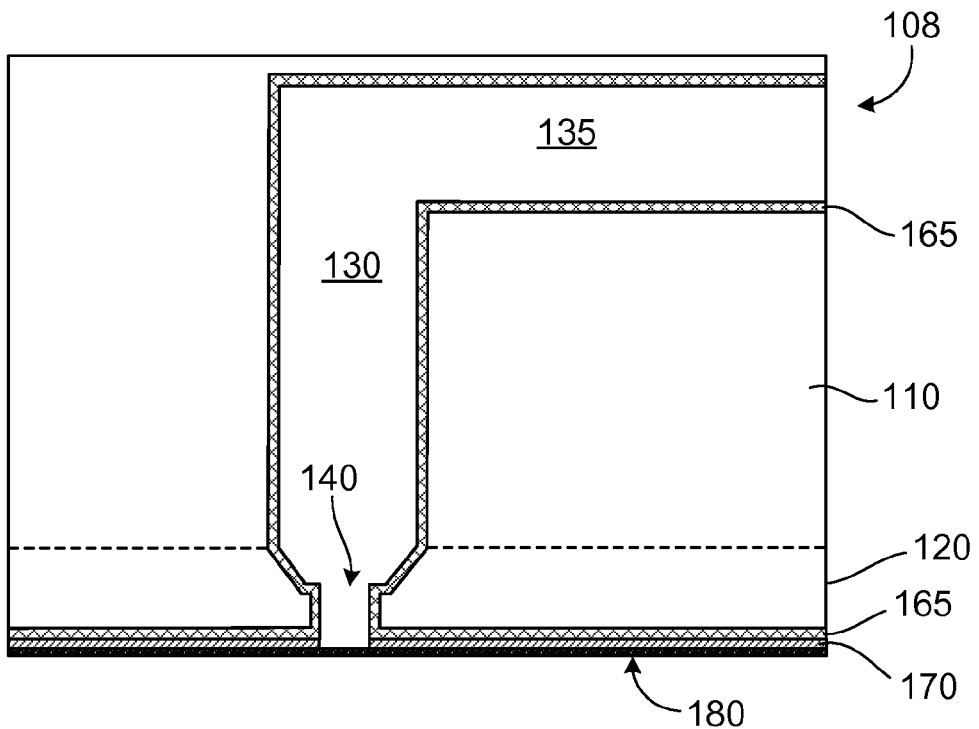
FIG. 3A is a cross-sectional view of an implementation of the fluid ejector from FIG. 1D with the non-wetting coated removed from the interior surface.
Figure 3B:
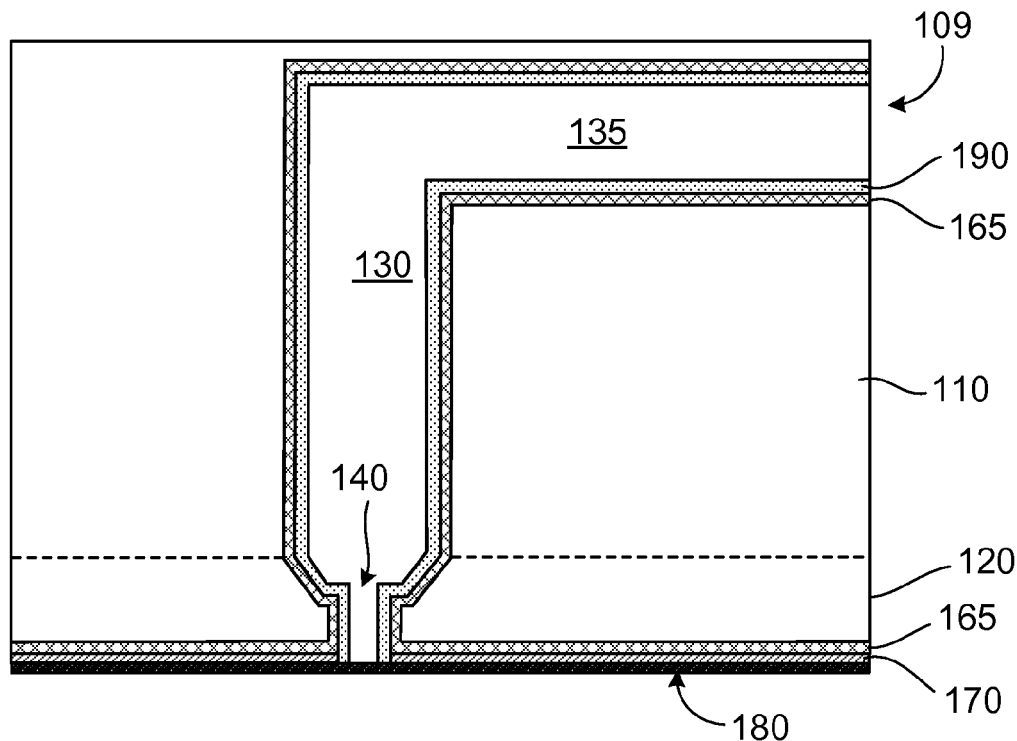
FIG. 3B is a cross-sectional view of an implementation of the fluid ejector from FIG. 3A with an overcoat layer coating an interior surface.
Figure 3C:
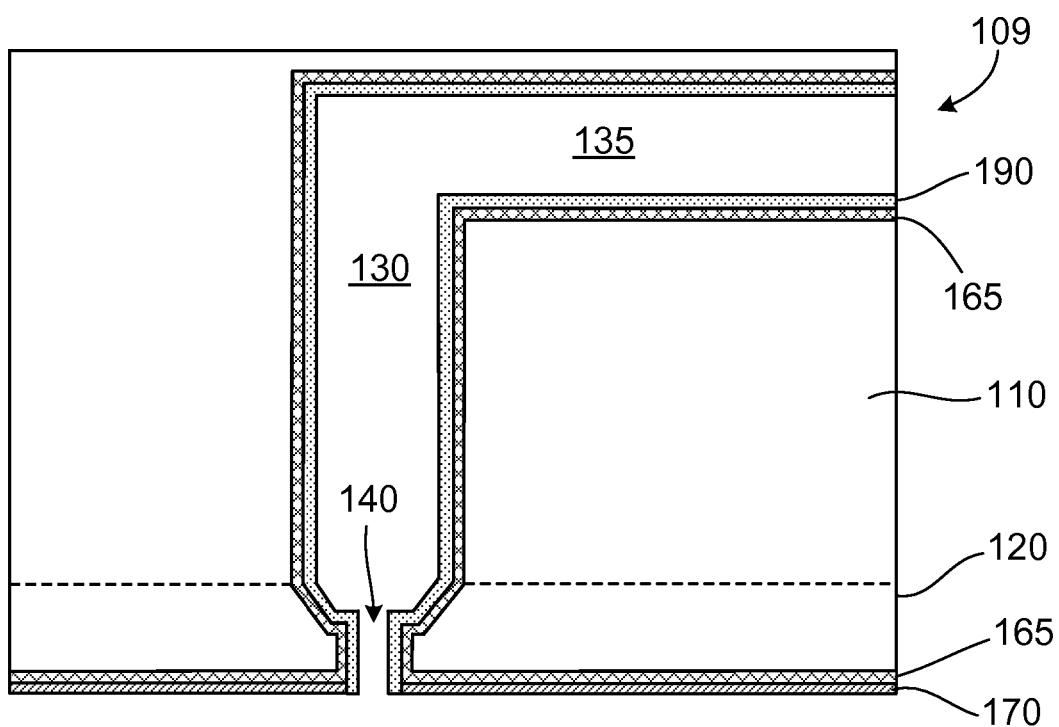
FIG. 3C is a cross-sectional view of an implementation of the fluid ejector from FIG. 3B with the mask removed.

Referring to FIGS. 3A-C, the cleaning step can be sufficiently effective that the non-wetting coating 170 is completely removed from interior surfaces before overcoat layer 190 is deposited. In FIG. 3A, non-wetting coating 170 has been removed (e.g. by applying an oxygen plasma to pumping chamber 135 and decender 130) from interior surfaces, or has not been deposited on interior surfaces, as described in U.S. application Ser. No. 11/479,152, the entire disclosure of which is herein incorporated by reference.

Referring to FIG. 3B, overcoat layer 190 has been deposited (e.g. by CVD, as discussed above) on at least exposed interior surfaces, resulting in fluid ejector 109. Overcoat layer 190 provides an exposed oxide surface in the completed device that is highly wetting. As noted above, the overcoat layer 190 can be deposited under the different conditions and have different material properties from the seed layer 165.

FIG. 3C shows fluid ejector 109 with mask 180 removed. The mask may be removed either before or after deposition of overcoat layer 190. The final completed device shown in FIG. 3C is a fluid ejector with exterior surfaces that are non-wetting, and interior surfaces that are more wetting than the non-wetting surfaces. A number of implementations of the invention have been described.

Nevertheless, it will be understood that various modifications may be made without departing from the spirit and scope of the invention. For example, method steps may be performed in a different order and still produce desirable results. Accordingly, other implementations are within the scope of the following claims.

What is claimed is:

1. A fluid ejector comprising:
   a nozzle layer having a nozzle, the nozzle layer including a first surface and a second surface, the first surface being an exterior surface of the nozzle layer and the second surface being an interior surface of the nozzle, the nozzle comprising an orifice formed in the first surface that allows fluid in contact with the second surface to be ejected;
   a seed layer covering the first surface and the second surface of the nozzle layer;
   a non-wetting layer covering portions of the seed layer on at least the first surface; and
   an overcoat layer covering a portion of the seed layer on the second surface but not a substantial portion of the seed layer on the first surface, the overcoat layer being more wetting than the non-wetting layer.

2. The fluid ejector of claim 1, wherein the non-wetting layer includes molecules which include at least one atom of each of carbon and fluorine.

3. The fluid ejector of claim 2, wherein the non-wetting layer is a monolayer.

4. The fluid ejector of claim 1 wherein the non-wetting layer is hydrophobic.

5. The fluid ejector of claim 1, wherein the overcoat layer is an inorganic oxide.

6. The fluid ejector of claim 5, wherein the inorganic oxide is silicon dioxide.

7. The fluid ejector of claim 1 wherein the overcoat layer is hydrophilic.

8. The fluid ejector of claim 1, wherein a portion of the overcoat layer is formed directly on the non-wetting layer.

9. The fluid ejector of claim 1, wherein the seed layer comprises an inorganic oxide layer.

10. The fluid ejector of claim 9, wherein the seed layer comprises silicon dioxide.

11. The fluid ejector of claim 1, wherein the overcoat layer is thinner than the seed layer.

12. The fluid ejector of claim 1, wherein the overcoat layer is more wettable than the seed layer.

13. The fluid ejector of claim 1, wherein a density of the overcoat layer is less than a density of the seed layer.

14. The fluid ejector of claim 1, wherein the thickness of the seed layer is between about 5 nm and about 200 nm.

15. A method for forming a non-wetting layer on a fluid ejector including a nozzle layer, the method comprising:
    depositing a non-wetting layer on a first surface and a second surface of the nozzle layer, the first surface being an exterior surface of the nozzle layer, the second surface being an interior surface of a nozzle in the nozzle layer, and the nozzle comprises an orifice formed in the first surface that allows fluid in contact with the second surface to be ejected;
    removing at least a portion of the non-wetting layer from the second surface; and
    depositing an overcoat layer on the second surface including any remaining portions of the non-wetting layer on the second surface, the overcoat layer being more wetting than the non-wetting layer.

16. The method of claim 15, wherein the non-wetting layer is deposited by vapor deposition.

17. The method of claim 15, further comprising applying a mask to the first surface before removing at least a portion of the non-wetting layer from the second surface, wherein applying the mask includes applying at least one of tape, photoresist, or wax.

18. The method of claim 17, further comprising removing the mask from the first surface after depositing the overcoat layer.

19. The method of claim 18 wherein removing the mask also removes overcoat layer deposited on the mask.

20. The method of claim 17 further comprising removing the mask from the first surface before depositing the overcoat layer, but after removing at least a portion of the non-wetting layer from the second surface.

21. The method of claim 20, wherein removing at least a portion the non-wetting coating includes exposing the fluid ejector to oxygen plasma.

22. The method of claim 20, wherein removing at least a portion of the non-wetting layer comprises removing less than all of the non-wetting layer.

23. The method of claim 20, wherein removing at least a portion of the non-wetting layer comprises removing all of the non-wetting layer.

24. The method of claim 15, wherein depositing the overcoat layer includes depositing an inorganic oxide.

25. The method of claim 24 wherein the inorganic oxide is silicon dioxide.

26. The method of claim 15 further comprising depositing an inorganic layer on the first and second surfaces prior to depositing the non-wetting layer.

27. A fluid ejector comprising:
    a nozzle layer having a nozzle, the nozzle layer including a first surface and a second surface, the first surface being an exterior surface of the nozzle layer and the second surface being an interior surface of the nozzle, and the nozzle comprising an orifice formed in the first surface that allows fluid in contact with the second surface to be ejected;
    a non-wetting layer covering at least a portion of the first surface and at least a portion of the second surface; and
    an overcoat layer covering the second surface including the non-wetting layer on at least a portion of the second surface but not a substantial portion of the first surface, the overcoat layer being more wetting than the non-wetting layer.

28. The fluid ejector of claim 27 wherein the non-wetting layer completely covers the second surface and the overcoat layer completely covers the non-wetting layer on the second surface.

29. The fluid ejector of claim 27, wherein the nozzle layer comprises silicon.

30. The fluid ejector of claim 27, wherein the overcoat layer comprises silicon dioxide.

31. The fluid ejector of claim 27, further comprising a deposited seed layer on the first surface and second surface underneath the non-wetting layer and the overcoat layer.

* * * * *

UNITED STATES PATENT AND TRADEMARK OFFICE
CERTIFICATE OF CORRECTION

PATENT NO. : 8,128,201 B2
APPLICATION NO. : 11/948692
DATED : March 6, 2012
INVENTOR(S) : Yoshimasa Okamura Page 1 of 1

It is certified that error appears in the above-identified patent and that said Letters Patent is hereby corrected as shown below:

Col. 8, line 41;
In Claim 21, after "portion" insert -- of --.

Signed and Sealed this
Second Day of October, 2012

David J. Kappos
*Director of the United States Patent and Trademark Office*